(12) United States Patent
Lin et al.

(10) Patent No.: US 6,979,636 B1
(45) Date of Patent: Dec. 27, 2005

(54) METHOD FOR FORMING HEIGHTENED SOLDER BUMPS ON CIRCUIT BOARDS

(75) Inventors: Cheng-Yuan Lin, Taoyuan Hsien (TW); Te-Chang Huang, Taoyuan Hsien (TW)

(73) Assignee: Compeq Manufacturing Co., Ltd., Taoyuan Hsien (TW)

( * ) Notice: Subject to any disclaimer, the term of this patent is extended or adjusted under 35 U.S.C. 154(b) by 0 days.

(21) Appl. No.: 11/052,890

(22) Filed: Feb. 9, 2005

(51) Int. Cl.$^7$ ............................................. H01L 21/44
(52) U.S. Cl. ...................... 438/613; 257/738
(58) Field of Search ............... 438/612, 613; 257/737

(56) References Cited

U.S. PATENT DOCUMENTS 6,468,893 B2 * 10/2002 Ueoka ..................... 438/612

* cited by examiner

*Primary Examiner*—David Nelms
*Assistant Examiner*—Quoc Hoang
(74) *Attorney, Agent, or Firm*—Rosenberg, Klein & Lee

(57) ABSTRACT

The present invention relates a method for forming heightened solder bumps on a circuit board, which has a surface formed with a plurality of pads and a solder resist thereon and the pads are exposed from the solder resist. The steps of the method mainly are: firstly, applying a first stencil printing and a first reflow process to the circuit board so that a plurality of first solder bumps form on the pads respectively. Then, apply a second stencil printing and a second reflow process to the circuit board so as to have solder paste formed on the first solder bumps and to have the solder paste integrated with the first solder bumps respectively to form the heightened solder bumps on the pads.

5 Claims, 3 Drawing Sheets

METHOD FOR FORMING HEIGHTENED SOLDER BUMPS ON CIRCUIT BOARDS

TECHNICAL FIELD

The present invention generally relates to a field of circuit board manufacture and more particularly, relates to a method for forming heightened solder bumps on a circuit board.

BACKGROUND OF THE INVENTION

Pads exposed from solder resists are provided for soldering with surface mount devices, such as ball grid array (BGA), quad flat package (QFP) and so on. In general, the pads made of copper, gold, or silver etc. are not easily to bind with solder immediately. Therefore, the pads are usually precoated with the solder for improving solder wettability and self-alignment effect, while bumps of the BGA or a flip chip are soldered with the pads. In addition, the precoated solder generally forms with certain heights and shapes on the pads, such spherical shapes for soldering with the bumps of the BGA or the flip chip easily. Thus, the solder precoating procedure is considered as an essential procedure for the surface mounting technology.

A conventional method for solder precoating applies a stencil printing method. The stencil printing method firstly applies a mask with hollowed patterns to a circuit board and the hollowed patterns of the mask are designed for corresponding to pads of the circuit board. Then, mask is overlaid to the circuit board and the hollowed patterns of the mask are filled with solder paste by a squeegee. Next, remove the mask and apply a reflow process to the circuit board so as to make the solder paste formed into solder bumps for soldering with the surface mount devices.

In addition, the hollowed patterns of mask are hard to achieve fine pitch demands if have solder height requirement, such as bump pitch <150 um, because limitations in thickness of the mask and means to form the hollowed patterns. In other words, the thickness of the mask is thicker, the yield of the solder bumps are poorer, namely fail in controlling the quantity of the solder paste. Therefore, due to the limitations, the solder bumps having a height of 20 um or 20 um above are in great demand, due to some devices need more solder while soldering.

SUMMARY OF INVENTION

The present invention mainly provides a method for forming heightened solder bumps on a circuit board to improve qualities of the solder bumps and to achieve the height demands for the solder bumps.

More specifically, the circuit board has a surface formed with a plurality of pads and a solder resist thereon and the pads are exposed from the solder resist. The steps of the method mainly are: firstly, applying a first stencil printing and a first reflow process to the circuit board so that a plurality of first solder bumps form on the pads respectively. Then, apply a second stencil printing and a second reflow process to the circuit board so as to have solder paste formed on the first solder bumps and to have the solder paste integrated with the first solder bumps respectively to form the heightened solder bumps on the pads.

Therefore, the heightened solder bumps of the present invention have preferred dimensions and heights that satisfy the demands for soldering.

BRIEF DESCRIPTION OF DRAWINGS

The invention will be more clearly understood after referring to the following detailed description read in conjunction with the drawings wherein.

DETAILED DESCRIPTION OF PREFERRED EMBODIMENTS

Figure 1:
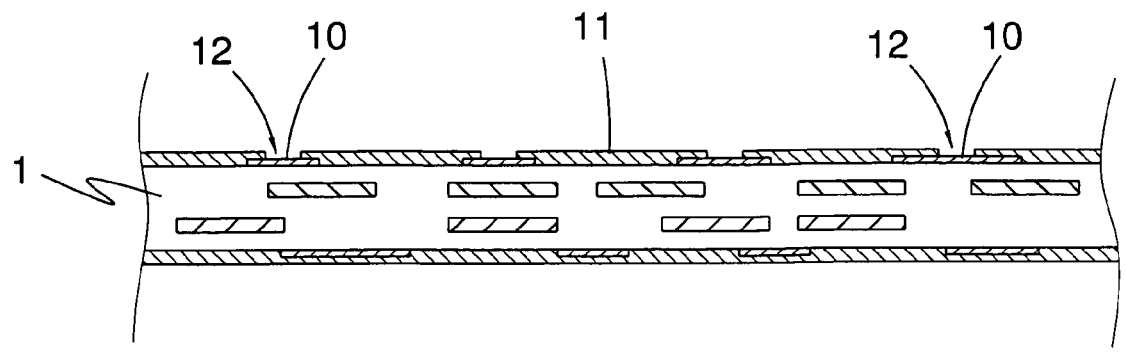
FIG. 1 is a cross sectional view of part of a circuit board as a preferred embodiment of the present invention, illustrating the circuit board formed with pads and solder resist.

FIGS. 1–9 show a preferred embodiment of the present invention and sequential steps of a method for forming heightened solder bumps on a circuit board. In FIG. 1, the circuit board 1 is a multilayer circuit board with conductor patterns, which include a plurality of pads 10. In addition, the circuit board 1 has a surface formed with a solder resist 11 having a plurality of openings 12 for exposing the pads 10 respectively and correspondingly, so the pads could be applied to solder with electronic components.

Figure 2:
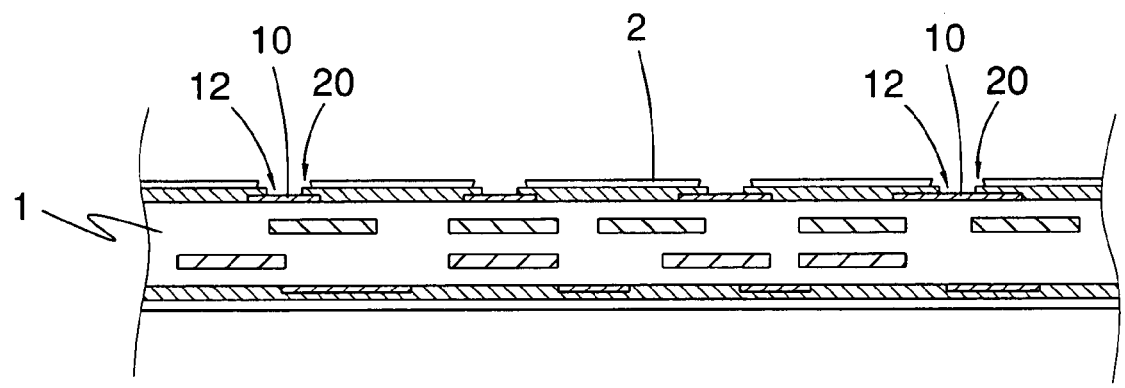
FIG. 2 illustrates a subsequent step to FIG. 1, showing a first mask overlaid on the circuit board.
Figure 3:
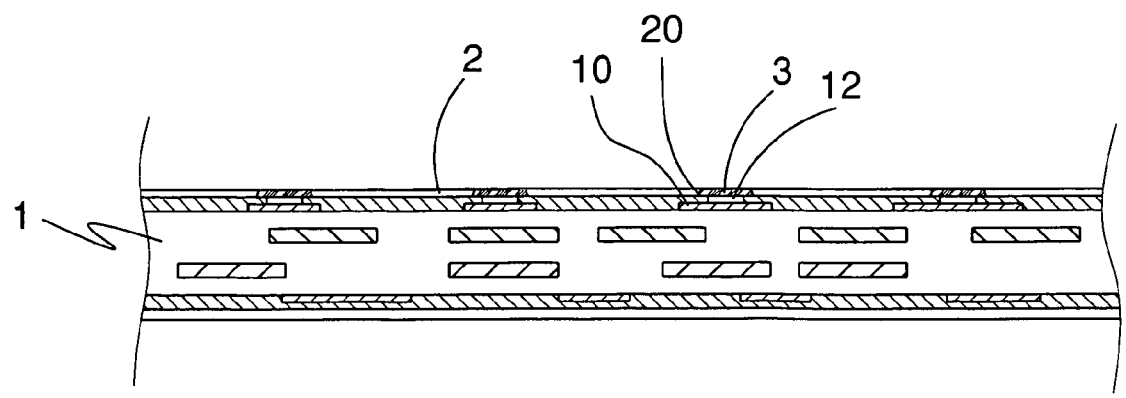
FIG. 3 illustrates a subsequent step to FIG. 2, showing first holes of the first mask filled with first solder paste.

As shown in FIG. 2, a first mask 2 is overlaid on the surface of the circuit board 1. The first mask 2 has a plurality of first holes 20, which are corresponding to the pads 10 of the circuit board 1 respectively. In FIG. 3, the first holes 20 of the first mask 2 are filled with first solder paste 3 by a squeegee (not shown) in a quick and light squeeze manner. In such manner, the quantity of the first solder paste 3 is provided for filling the first holes 20 of the first mask 2 only.

Figure 4:
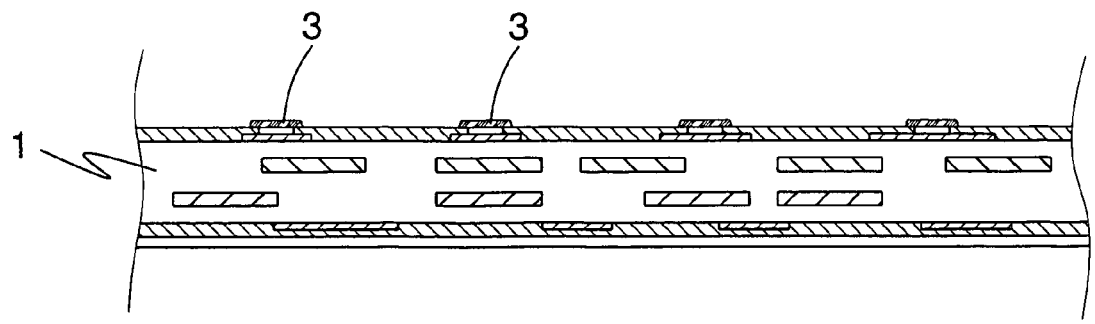
FIG. 4 illustrates a subsequent step to FIG. 3, showing the first mask being removed.
Figure 5:
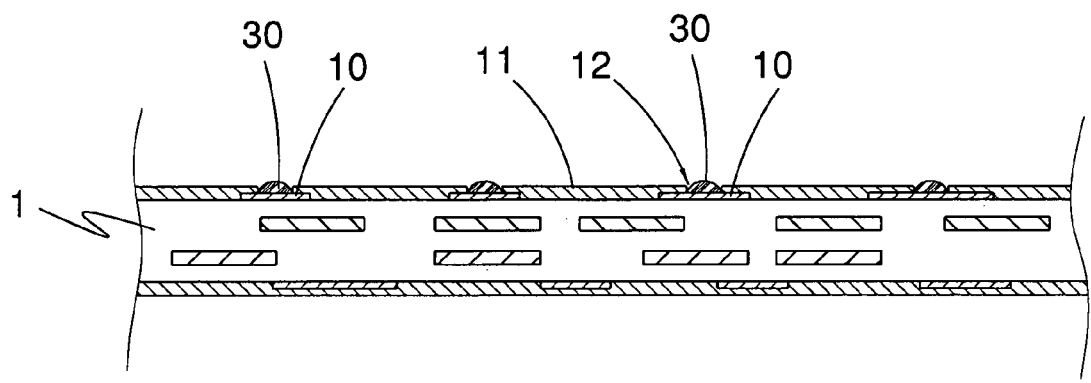
FIG. 5 illustrates a subsequent step to FIG. 4, showing the first solder paste forming into first solder bumps after a first reflow process.

FIG. 4 shows that the first mask 2 is removed from the circuit board 1 and the first solder paste 3 is remaining on the circuit board 1. After applying a first reflow process to the circuit board 1, the first solder paste 3 forms into a plurality of first solder bumps 30 on the pads 10 of the circuit board 1 respectively, as shown in FIG. 5. The first solder paste 3 are melted and flowed into the openings 12 of the solder resist 11 by the first reflow process and gravity. Subsequently, the melted first solder paste 3 forms and agglomerates into the first solder bumps 30 with spherical shapes by tension. Because, the first solder paste 3 is applied to the circuit board 1 by a small quantity and the first solder paste 3 has characteristics of large granular structure and low density, the dimensions of the first solder bumps 30 are small.

Figure 6:
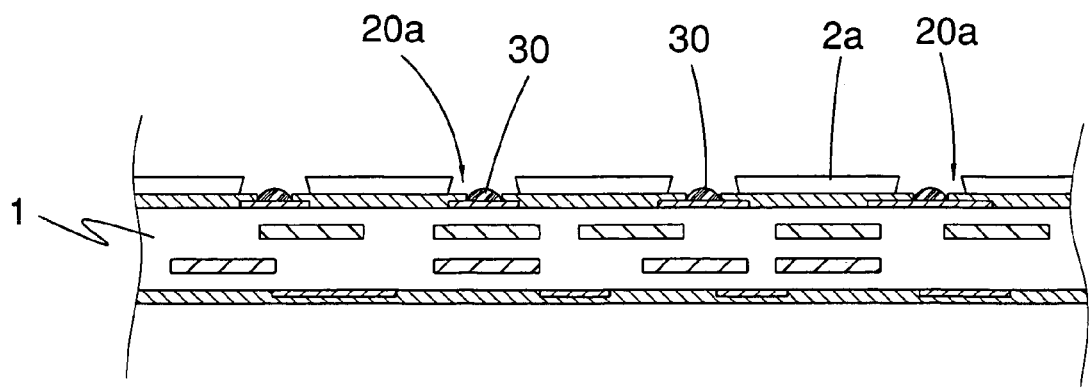
FIG. 6 illustrates a subsequent step to FIG. 5, showing a second mask overlaid on the circuit board.
Figure 7:
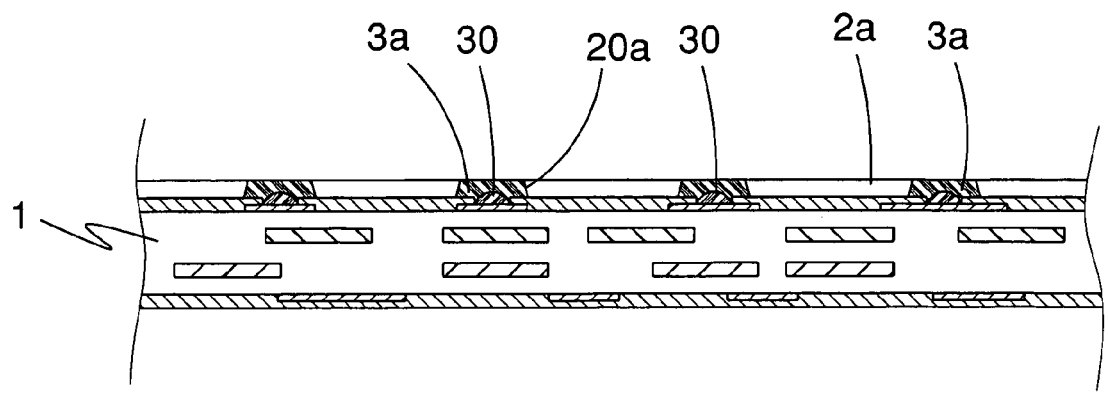
FIG. 7 illustrates a subsequent step to FIG. 6, showing second holes of the second mask filled with second solder paste.

As shown in FIG. 6, a second mask 2a is overlaid on the surface of the circuit board 1. The second mask 2a has a plurality of second holes 20a, which are corresponding to the first solder bumps 30 respectively. In addition, the second holes 20a of the second mask 2a are preferred to have diameters greater than the diameters of the first holes 20 of the first mask 2. FIG. 7 shows the second holes 20a of the second mask 2a are filled with second solder paste 3a by the squeegee. Furthermore, the second mask 2a is preferred to have a thickness greater than the thickness of the first mask 2 in the embodiment; therefore, the squeegee applies a slow and hard squeeze manner to fill the second holes 20a of the second mask 2a with the second solder paste 3a. In such manner, the quantity of the second solder paste 3a is sufficiently provided for filling the second holes 20a of the second mask 2a and covering the first solder bumps 30a entirely.

Figure 8:
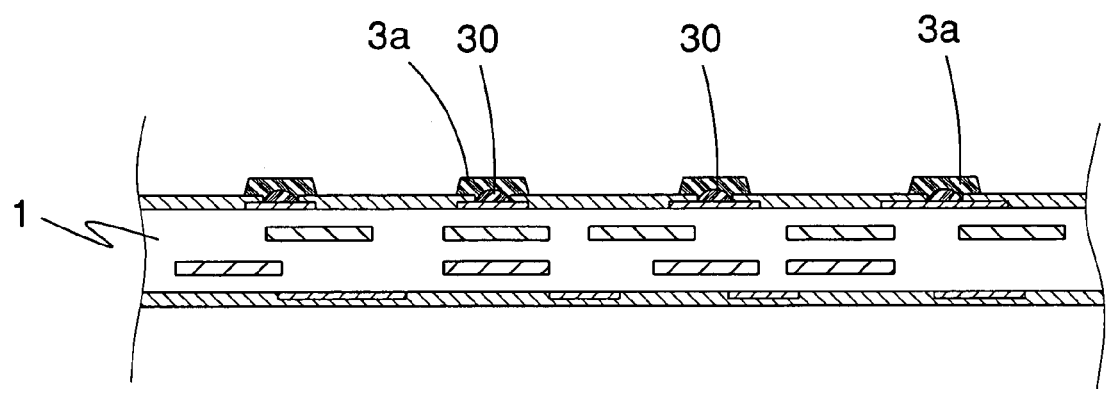
FIG. 8 illustrates a subsequent step to FIG. 7, showing the second mask being removed.
Figure 9:
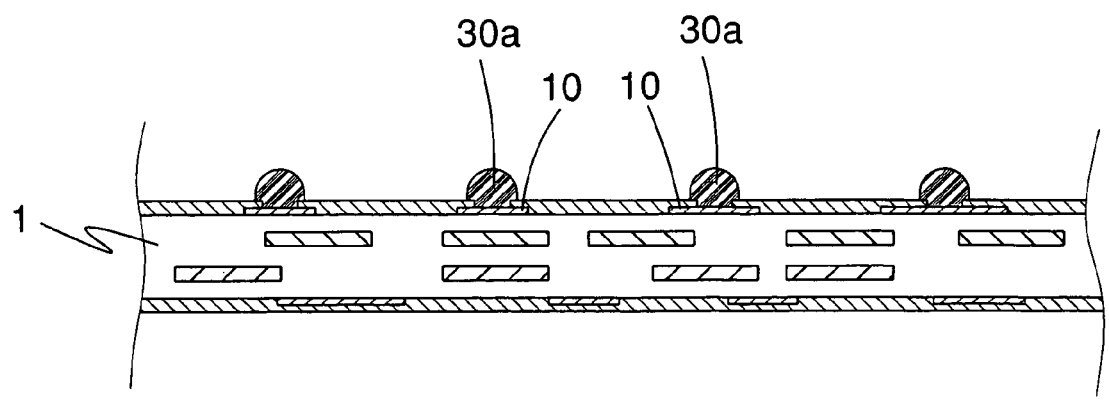
FIG. 9 illustrates a subsequent step to FIG. 8, showing the second solder paste integrated with the first solder bumps to form heightened solder bumps after a second reflow process.

Furthermore, FIG. 8 shows that the second mask 2a is removed from the circuit board 1 and the second solder paste 3a is remaining on the circuit board 1. After applying a second reflow process to the circuit board 1, the second solder paste 3a remaining on the circuit board 1 integrates with the first solder bumps 30 respectively to form the heightened solder bumps 30a on the pads 10 of the circuit board 1, as shown in FIG. 9. The second solder paste 3a and the first solder bumps 30 are melted in one respectively by the first reflow process and subsequently the integrated second solder paste 3a and the first solder bumps 30 form and agglomerate into the heightened solder bumps 30a with spherical shapes by tension. Because, the second solder paste 3a is applied to the circuit board 1 by a large quantity and the second solder paste 3a has characteristics of small granular structure and high density, the dimensions of the heightened solder bumps 30a are large upwardly.

According to the above mentioned embodiment of the present invention, the method of the present invention applies the stencil printing procedure twice to form heightened solder bumps. In addition, a first stencil printing procedure is to form small dimensional solder bumps and a second stencil printing procedure is to form large dimensional solder bumps, which integrate with the small dimensional solder bumps. Therefore, after experiments on some devices, which demand for small bump pitches and high solder bumps, the heights of the heightened solder bumps of the present invention have heights of 20 um averagely that are greater than the heights of the conventional solder bumps, which have heights of 10 um formed by applying one time stencil printing only.

From the foregoing descriptions, any person skilled in the art could be sufficiently taught that the stencil printing procedure is repeated by several times, the solder bumps are heightened accordingly and gradually. Furthermore, varied applications of the thicknesses of the masks, quantities and densities of the solder paste, and printing manners also determine the qualities and the heights of the heightened solder bumps. According to the present invention, the heightened solder bumps formed on the circuit board assist in soldering with the devices when more solder is required during soldering.

Numerous characteristics and advantages of the invention have been set forth in the foregoing description, together with details of the structure and function of the invention, and the novel features thereof are pointed out in appended claims. The disclosure, however, is illustrated only, and changes may be made in detail, especially, in matters of shape, size and arrangement of parts, materials and the combination thereof within the principle of the invention, to the full extent indicated by the broad general meaning of the terms in which the appended claims are expressed.

We claim:

1. A method for forming heightened solder bumps on a circuit board, which has a surface formed with a plurality of pads and a solder resist thereon, and the pads are exposed from the solder resist, the method comprising the steps of:
    overlaying a first mask on the surface of the circuit board, the first mask having a plurality of first holes corresponding to the pads of the circuit board respectively;
    filling the first holes of the first mask with first solder paste by a squeegee in a quick and light squeeze manner;
    removing the first mask;
    applying a first reflow process to the circuit board, whereby the first solder paste remaining on the circuit board forms into a plurality of first solder bumps on the pads of the circuit board respectively;
    overlaying a second mask on the surface of the circuit board, the second mask having a plurality of second holes corresponding to the first solder bumps respectively, wherein the second mask has a thickness greater than the thickness of the first mask;
    filling the second holes of the second mask with second solder paste by the squeegee in a slow and hard squeeze manner, wherein the second solder paste has a density greater than the density of the first solder paste;
    removing the second mask; and
    applying a second reflow process to the circuit board, whereby the second solder paste remaining on the circuit board integrates with the first solder bumps respectively to form the heightened solder bumps on the pads.

2. A method for forming heightened solder bumps on a circuit board, which has a surface formed with a plurality of pads and a solder resist thereon, and the pads are exposed from the solder resist, the method comprising the steps of:
    applying a first stencil printing to the circuit board, so as to form first solder paste on each of the pads respectively;
    applying a first reflow process to the circuit board, whereby the first solder paste forms into a plurality of first solder bumps on the pads respectively;
    applying a second stencil printing to the circuit board, so as to form second solder paste on each of the first solder bumps respectively; and
    applying a second reflow process to the circuit board, whereby the second solder paste integrates with the first solder bumps respectively to form the heightened solder bumps on the pads, wherein the step of the first stencil printing is further performed by a squeegee in a quick and light squeeze manner and the step of the second stencil printing is performed by the squeegee in a slow and hard squeeze manner.

3. The method of claim 2, wherein the step of the first stencil printing is performed by a first mask having a plurality of first holes and the step of the second stencil printing is performed by a second mask having a plurality of second holes, which have diameters greater than the diameters of the first holes, wherein the second mask has a thickness grater than the thickness of the first mask.

4. The method of claim 2, wherein the second solder paste has a density greater than the density of the first solder paste.

5. The method of claim 2, further comprising the step of:
    applying N times of the stencil printing and N times of the reflow process to the circuit board, wherein N>2.

* * * * *